(12) United States Patent
Abadeer et al.

(10) Patent No.: US 7,227,239 B2
(45) Date of Patent: Jun. 5, 2007

(54) RESETTABLE FUSE DEVICE AND METHOD OF FABRICATING THE SAME

(75) Inventors: Wagdi William Abadeer, Jericho, VT (US); John Atkinson Fifield, Underhill, VT (US); Robert J. Gauthier, Jr., Hinesburg, VT (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/948,773

(22) Filed: Sep. 23, 2004

(65) Prior Publication Data
US 2006/0060938 A1    Mar. 23, 2006

(51) Int. Cl.
H01L 29/00 (2006.01)
H01L 21/44 (2006.01)
(52) U.S. Cl. ............... 257/529; 257/530; 257/289; 257/347; 257/353; 257/356; 257/300
(58) Field of Classification Search ............... 257/529, 257/528, 527, 378, 377, 379, 380
See application file for complete search history.

(56) References Cited

U.S. PATENT DOCUMENTS

| | | | | |
|---|---|---|---|---|
| 3,646,527 A | * | 2/1972 | Wada et al. ............... | 365/184 |
| 2003/0122200 A1 | * | 7/2003 | Kamiya et al. ............ | 257/379 |

* cited by examiner

*Primary Examiner*—Evan Pert
*Assistant Examiner*—Fazli Erdem
(74) *Attorney, Agent, or Firm*—Rabin & Berdo, PC

(57) ABSTRACT

A resettable fuse device is fabricated on one surface of a semiconductor substrate (10) and includes: a gate region (20) having first and second ends; a source node (81) formed in proximity to the first end of the gate region; an extension region (52) formed to connect the source node to the first end of the gate region; and a drain node (80) formed in proximity to the second end of the gate region and separated from the gate region by a distance (D) such that upon application of a predetermined bias voltage to the drain node a connection between the drain node and the second end of the gate region is completed by junction depletion. A gate dielectric (30) and a gate electrode (40) are formed over the gate region. Current flows between the source node and the drain node when the predetermined bias is applied to both the drain node and the gate electrode.

3 Claims, 6 Drawing Sheets

RESETTABLE FUSE DEVICE AND METHOD OF FABRICATING THE SAME

BACKGROUND OF THE INVENTION

1. Field of the Invention

The invention relates to a simple resettable fuse device that can be used in digital and analog integrated circuits for the adding or removing circuit elements on a dynamic basis.

2. Background Information

Fuse devices are useful in integrated circuits for disconnecting or disabling failed circuit elements. In a RAM cell array, for example, it is well known in the art to fabricate on the silicon chip miniature metallic fuses that are in series with the memory data lines. If in the process of testing during the manufacturing cycle, a defective memory location is detected, the appropriate hard fuse can be severed, rendering the bad location inoperable. While simple to fabricate, a disadvantage of the hard fuse is that the change is permanent. Moreover, once the RAM cell array is sealed after testing, any further failures of memory locations cannot be cannot corrected by severing fuse links, and the entire device may have to be scrapped.

Another disadvantage of hard fuses is they are severed by laser cutting and therefore must be placed away from other sensitive parts of the chip. This tends to increase the distance that signals on the data lines must travel, an undesirable feature in high speed, high density, microelectronic circuits.

Soft fuse devices disclosed in the prior art overcome some of the disadvantages of using hard fuses in integrated circuits. For example, U.S. Pat. No. 6,384,665 to Smoszna discloses the use of a programmable soft fuse for disabling a signal line in a RAM cell array, which includes an electronic switching circuit, a latch, a control circuit and a reset circuit. In Smoszna, these circuits are used in conjunction with an address decoder to test the RAM cell array to locate failing bits, word lines or bit lines on the array, and enter the location of the bad bits into the decoder. When the address does not correspond to a failed bit, the latches of the corresponding programmable soft fuse are set so as to allow the address signal to go to the array. However, if the address corresponds to one of the failed bits, then the latches are set so as to prevent the address signal form going to the array, and in that case, additional shifting circuitry connected to the address decoder can reroute the data to another redundant word line or bit line.

While soft fuses disclosed in the prior art address some of the shortcomings of hard fuses, what is needed is simple soft fuse device that can be adapted to use in a variety of digital and analog integrated circuits.

SUMMARY OF THE INVENTION

It is, therefore, a principle object of this invention to provide a resettable fuse device and method of fabricating the same.

It is another object of the invention to provide a resettable fuse device that solves the above-mentioned problems.

These and other objects of the present invention are accomplished by the resettable fuse device and method of fabricating the same disclosed herein.

In an exemplary aspect of the invention, a resettable fuse device is fabricated on one surface of a semiconductor substrate and includes: a gate region having first and second ends; a source node formed in proximity to the first end of the gate region; an extension region formed to connect the source node to the first end of the gate region; and a drain node formed in proximity to the second end of the gate region and separated from the gate region by a distance such that upon application of a predetermined bias voltage to the drain node a connection between the drain node and the second end of the gate region is completed by junction depletion. A gate dielectric and a gate electrode are formed over the gate region. Current flows between the source node and the drain node when the predetermined bias is applied to both the drain node and the gate electrode. Preferably, the predetermined bias voltage applied to the drain node is no greater than a maximum voltage based on a gate dielectric breakdown model.

The exemplary resettable fuse device also includes a halo region formed between the extension region and the first end of the gate region. The halo region is formed of a different impurity type than the extension region.

The resettable fuse device may be either an NFET device having p-type impurities implanted in the channel region, or a PFET device having n-type impurities implanted in the channel region, depending upon the application.

In another aspect of the invention, a method for fabricating the inventive resettable fuse device includes the steps of: providing a semiconductor substrate having a hard mask formed on one surface; etching the hard mask to form a hole exposing a portion of the semiconductor substrate; implanting impurities in the exposed portion of the semiconductor substrate to form a gate region having a first end and a second end; forming a dielectric layer in the hole, over the gate region; forming spacers on the sidewalls of the hole at the first and second ends of the gate region; forming a gate electrode over the dielectric layer and the sidewall spacers, so as to fill the hole in the hard mask; removing the hard mask and the sidewall spacer at the first end of the gate region by etching; implanting impurities in the surface of the substrate exposed by the removal of the hard mask and the sidewall spacer to form an extension region extending from the first end of the gate region, and a halo region between the extension region and the first end of the gate region; removing the hard mask at the second end of the gate region by etching; forming another sidewall spacer adjacent to the gate electrode at the first end of the gate region after forming the extension region and the halo region; implanting impurities in the substrate surface in proximity to the first end of the gate region to form a source node which is in contact with the extension region; and implanting impurities in the substrate surface in proximity to the second end of the gate region to form a drain node which is separated from the gate region by a distance such that upon application of a predetermined bias voltage to the drain node a connection between the drain node and the second end of the gate region is completed by junction depletion.

To preclude ion implantation in the vicinity of the second end of the gate region during formation of the extension region and the halo region, a photo-resist mask may be temporarily disposed over portions of the hard mask and the gate electrode. In the alternative, the same objective may be achieved without the use of a mask by aligning the semiconductor substrate on the apparatus used for ion implantation so as to preclude implantation in the vicinity of the second end of the gate region.

In the exemplary embodiment of the resettable fuse device, the semiconductor substrate is preferably a silicon substrate or wafer, the hard mask and the sidewall spacers are preferably composed of silicon nitride, and the gate electrode may be composed of an intrinsic polysilicon, an in-situ doped polysilicon, or a metallic material.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

The present invention is directed toward a simple resettable fuse device that can be used in digital and analog integrated circuits for the adding or removing circuit elements on a dynamic basis.

Figure 1:
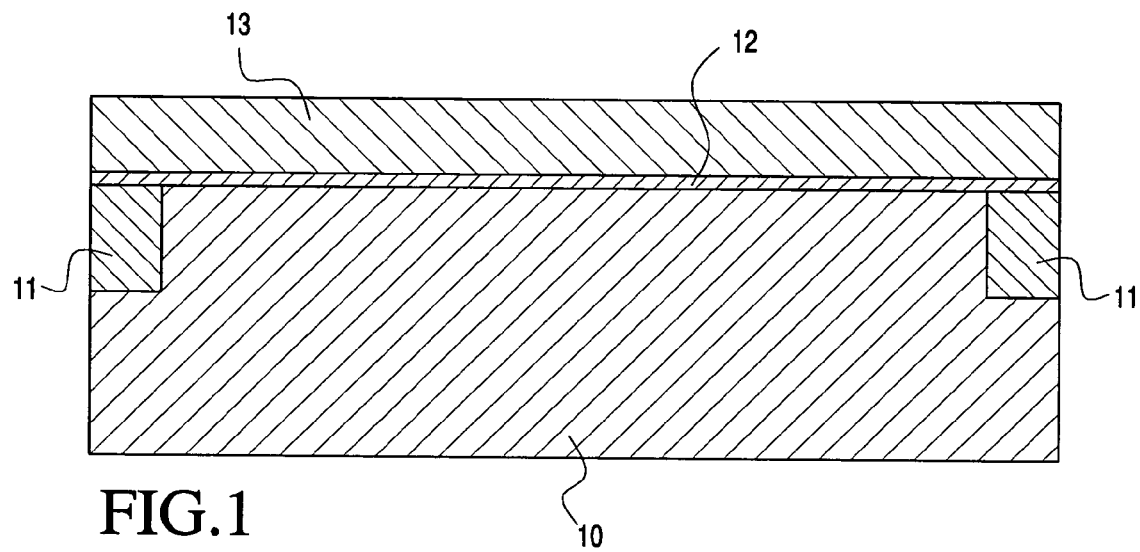
FIG. 1 is a cross-sectional view illustrating a first stage in the fabrication of a resettable fuse device according to the present invention.

An exemplary method of fabricating the inventive resettable fuse device is illustrated in FIGS. 1-7, and will help in understanding the operation of the device, discussed below. FIG. 1 shows a starting wafer or substrate 10, typically of silicon, having an isolation oxide 11 already formed using a standard technique, such as shallow trench isolation. FIG. 1 further shows a pre-existing dielectric layer 12, typically silicon oxide, formed on the surface of substrate 10 and a hard mask 13, typically composed of silicon nitride, formed on top of the dielectric layer.

Figure 2:
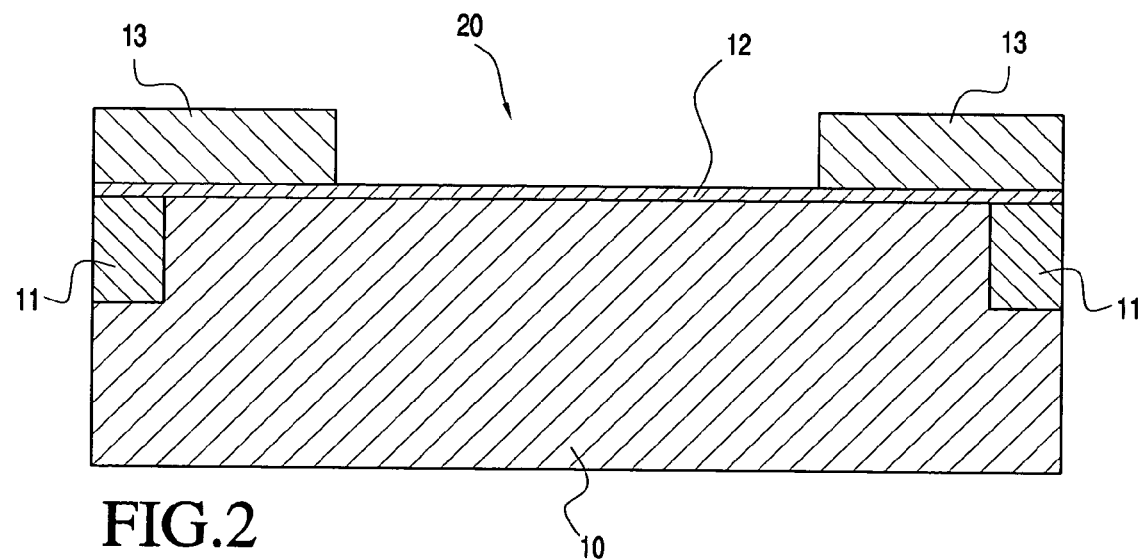
FIG. 2 is a cross-sectional view illustrating a second stage in the fabrication of the inventive resettable fuse device.

Using a photo-resist layer (not shown) the hard mask 13 is patterned and etched to form an open region 20, as illustrated in FIG. 2, in which a gate region will be formed.

Figure 3:
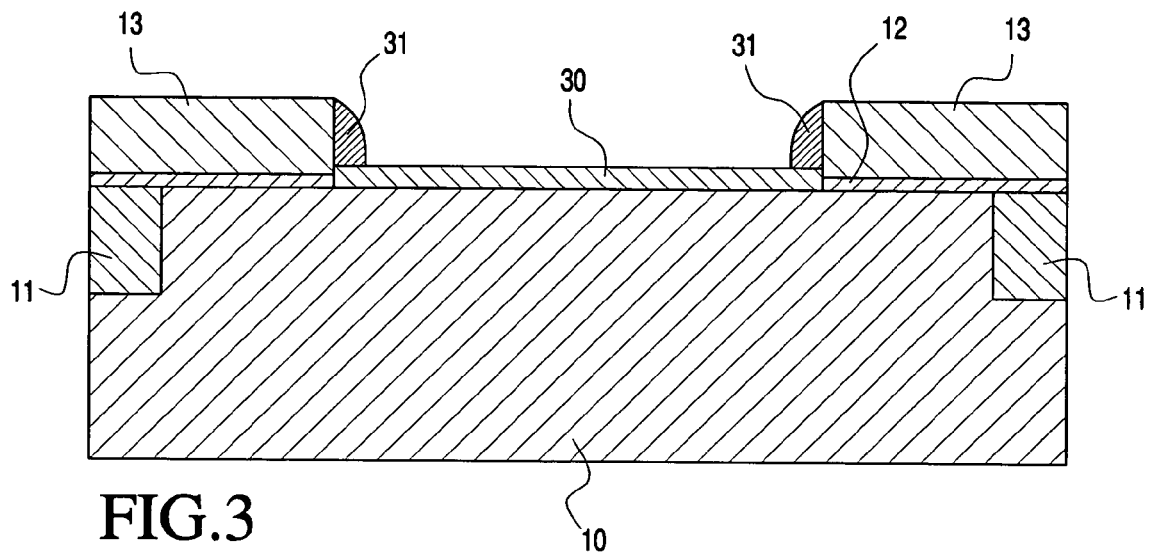
FIG. 3 is a cross-sectional view illustrating a third stage in the fabrication of the inventive resettable fuse device.

In FIG. 3, an ion implant (not shown) is used to add dopant impurities to the open region 20 in the hard mask 13 to form the gate region of the device. The energy is sufficient to allow ions to penetrate the silicon substrate 10, but not to penetrate the hard mask 13. Typical Implants are 5-10 Kev Boron with doses in the 12E12 to 10E13/cm$^2$ for surface implants. Higher energies are used to set punch through and well resistances. The figure shows one device type, in this case an NFET with p-type impurities. The dual is also possible, i.e., PFET devices with n-type impurities in the channel of the device. If both device types are required then a mask would have to be used to cover up one of the "holes" during fabrication of the other type device. If only one device type is used then such a "covering" mask is not required.

Following the implant process, a gate oxide (30) is grown. Optionally it can be grown in place of dielectric layer 12, in addition to dielectric layer 12, or dielectric layer 12 can be utilized instead. A silicon nitride spacer is 31 is then formed on the sidewall of the hard mask 13.

Figure 4:
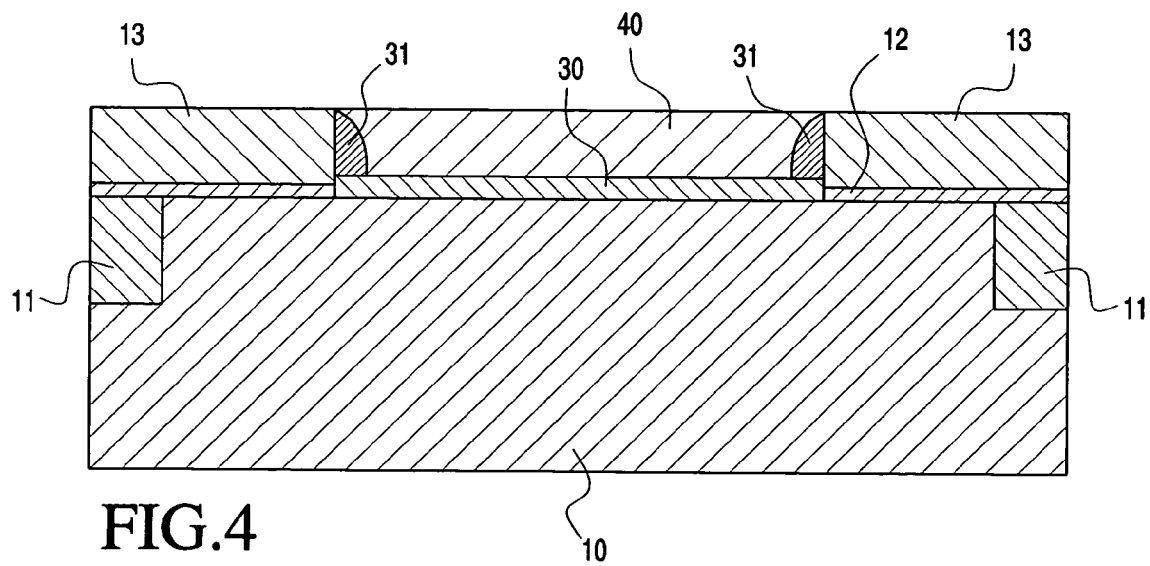
FIG. 4 is a cross-sectional view illustrating a fourth stage in the fabrication of the inventive resettable fuse device.

FIG. 4 shows that a damascene gate electrode 40 (which may, for example be intrinsic polysilicon, in-situ doped polysilicon, or a metal gate) is next deposited on the entire wafer, and then chemically/mechanically polished (which is a standard practice known in the art) so as to fill only the hole 20 in the hard mask 13.

Figure 5:
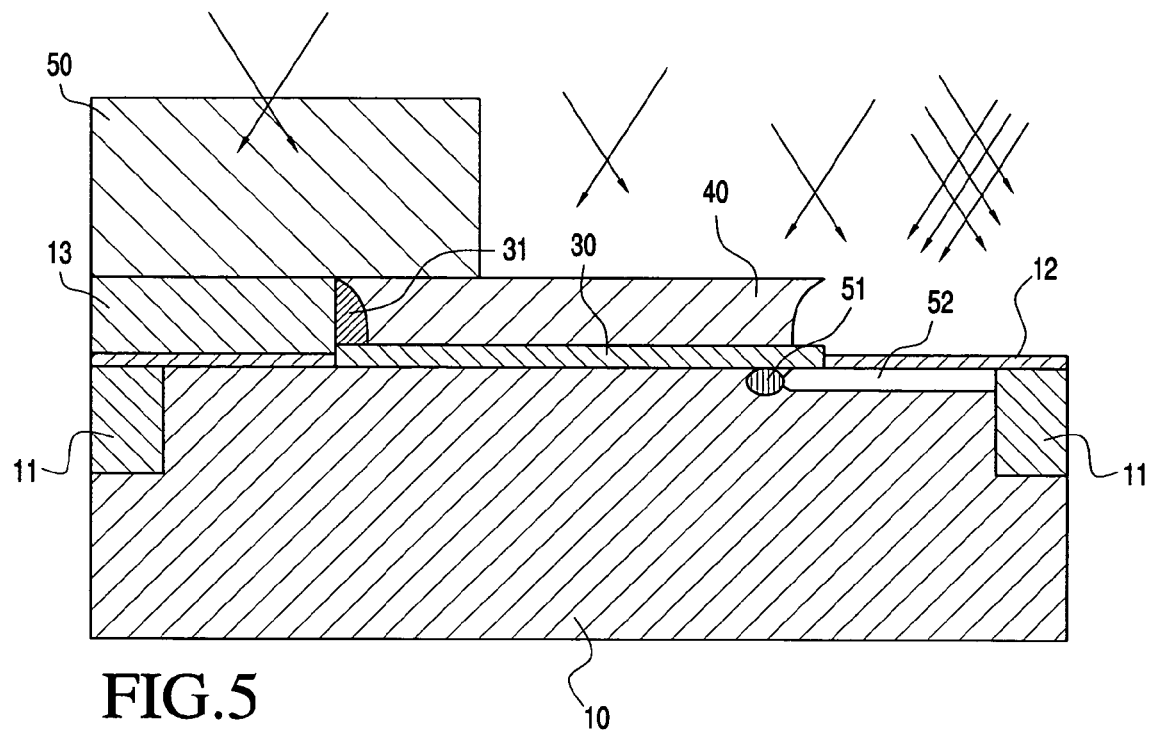
FIG. 5 is a cross-sectional view illustrating a fifth stage in the fabrication of the inventive resettable fuse device.

In FIG. 5, a photo resist mask 50 is used to expose one end of the device. The hard mask (13) and the sidewall spacer (31) are removed from the other end of the device by etching. A single side halo (51) and junction extension implant (52) are then formed by implantation. The gate electrode masks these from the internal body of the device, and the PR mask and the hard mask 13 keep the implants from entering the other end of the device. Note that the gate undercut naturally formed by the spacer (31) removal affords a region where gate oxide 30 is not covered by the gate electrode 40. This will become an important fact later on.

It should be noted that if the devices were all arranged on the wafer unidirectionally, then the masked used in FIG. 5 would not be required. In this alternative, the hard mask and spacer material could have all been etched, and the wafer directionally aligned to the implanter so as to place the junction extension 52 (p type for an NFET) and halo 51 (n type for an NFET) into only one side of the device. This type of device alignment is becoming standard practice in 65 nm technology.

Figure 6:
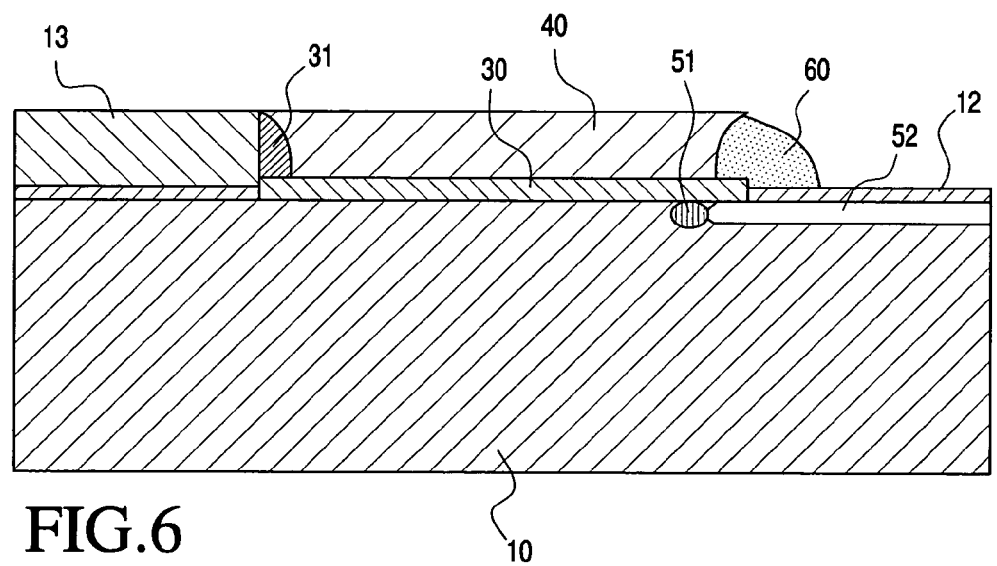
FIG. 6 is a cross-sectional view illustrating a sixth stage of fabrication of the inventive resettable fuse device.

In FIG. 6 a new spacer 60 is defined on the side of the gate that has been implanted with halo 51 and junction extension 52, and the photo resist mask 50 is removed. Again, if the gates were designed unidirectionally, this mask would not have been required.

Figure 7:
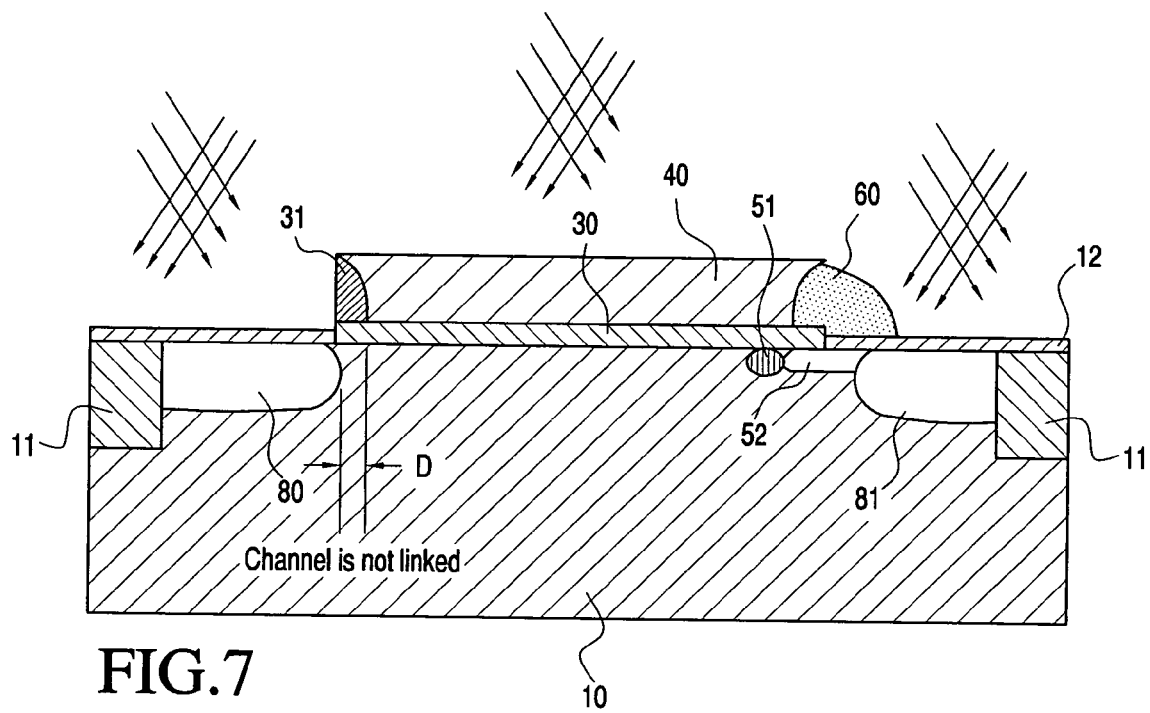
FIG. 7 is a cross-sectional view illustrating a seventh stage of fabrication of the inventive resettable fuse device.

In FIG. 7, the hard mask 13 is entirely removed, and a common N++ (for an NFET) is ion implanted, forming a high voltage node 80 and a low voltage node 81. As shown, the implant is not linked to the channel on one end of the gate, as it does not have junction extension 52 to assist in the link. The unlinked portion 80 is separated from the channel by the gate oxide 30 having the spacer 31 on top of it. In principle, this device can now support a high voltage on the un-linked end because the equivalent dielectric thickness in the unlinked portion 80 is much greater than in the linked portion 81. This feature is necessary in order to have the device function as a resettable fuse.

Figure 8:
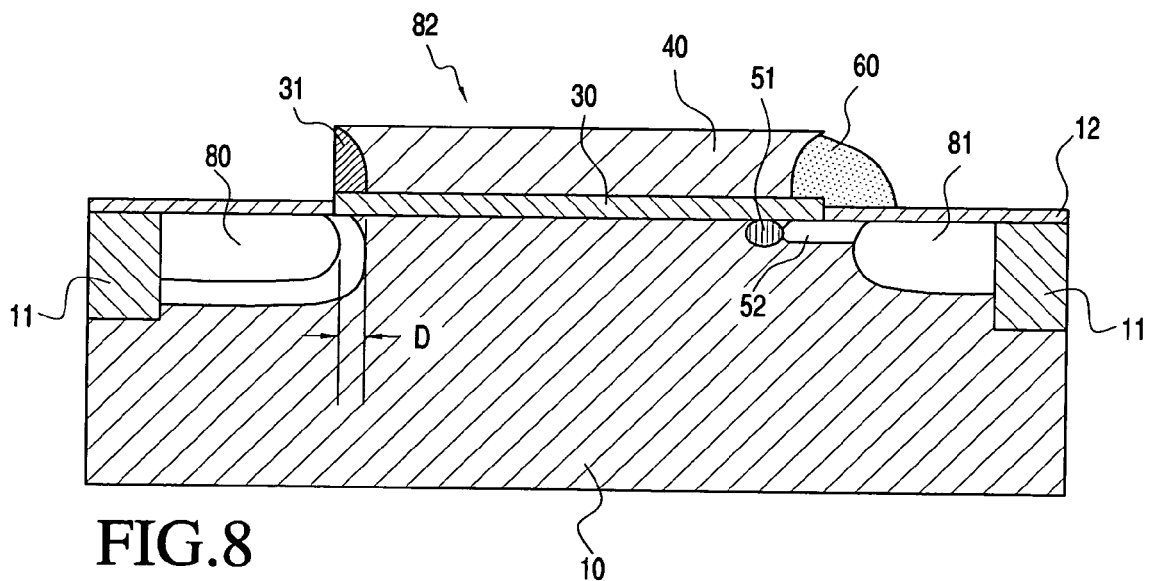
FIG. 8 is a cross-sectional view illustrating the operation of the inventive resettable fuse device with the application of high drain bias.

FIG. 8 shows how the device operates. Under a high bias on node 80, the channel is completed by junction depletion and the device can switch as a standard FET. This is the program mode.

Figure 9:
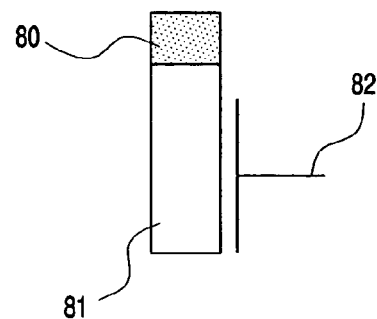
FIG. 9 is a schematic representation of a single soft fuse transistor according to the present invention.

FIG. 9 is a device schematic showing the terminals for the device, namely, high voltage fuse control node 80, common source node 81, and low voltage fuse scan node 82. In this case the device depicted is an NFET and current flow between nodes 80 and 81 will occur only when both nodes 80 and 82 are high.

The following is a consideration of the reliability aspects of the resettable fuse device described above, which bear on the way it can be used in various applications.

The channel of the device can be made long to eliminate any degradation due to hot carriers, but the device can also be made short and the hot carrier problem largely avoided if, when the fuse is to be energized, the gate voltage is applied to the gate node 82 before the high voltage node 80 is energized. Once the gate node 82 is high, the voltage at the high voltage node 80 can be raised. By doing so, switching the gate while the high junction is going positive is avoided, thus the device does not pass through the maximum substrate current condition (Vgs=0.5 Vds), which is the worst case for hot carriers. If the gate node 82 is high first, the hot carrier effect will be minimal. Of course, the operating conditions for the fuse should not be such that Vgs=0.5 Vds. Using this approach, any damage or degradation to the gate dielectric at the high voltage junction end is also minimized. By having the gate high first, the FET is prevented from being in gate breakdown condition at the high voltage node, which is when the diffusion is high and the gate is low. This is not a desirable condition. Because the device is energized only during soft fusing, the effect on the gate dielectric is minimized.

Figure 11:
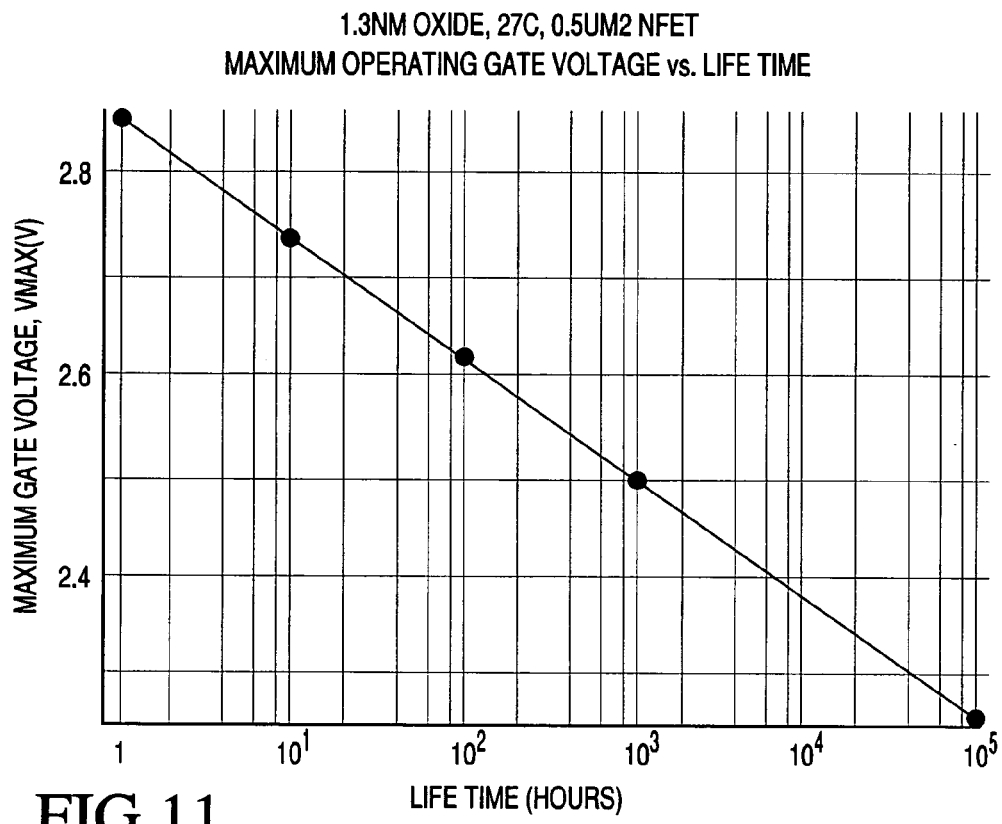
FIG. 11 is a graph of maximum operating gate voltage versus lifetime for an exemplary embodiment of the inventive resettable fuse device.

The number of safe fusing operations is determined from the gate dielectric breakdown model of the technology in question. As an example, for a 1.3 nm gate dielectric thickness, and with a soft fuse device oxide area of 0.5 $\mu m^2$, FIG. 11 shows that the relationship between $V_{max}$, the safe maximum gate voltage, and lifetime in hours at 27° C. For this example, with a nominal technology voltage of 1.2 V, the soft fuse gate voltage should be set to the technology voltage, or a voltage that is less than or equal to the $V_{max}$ of the technology, which FIG. 11 indicates is 2.26 volts for 10 years of operation at 27° C.

Figure 12:
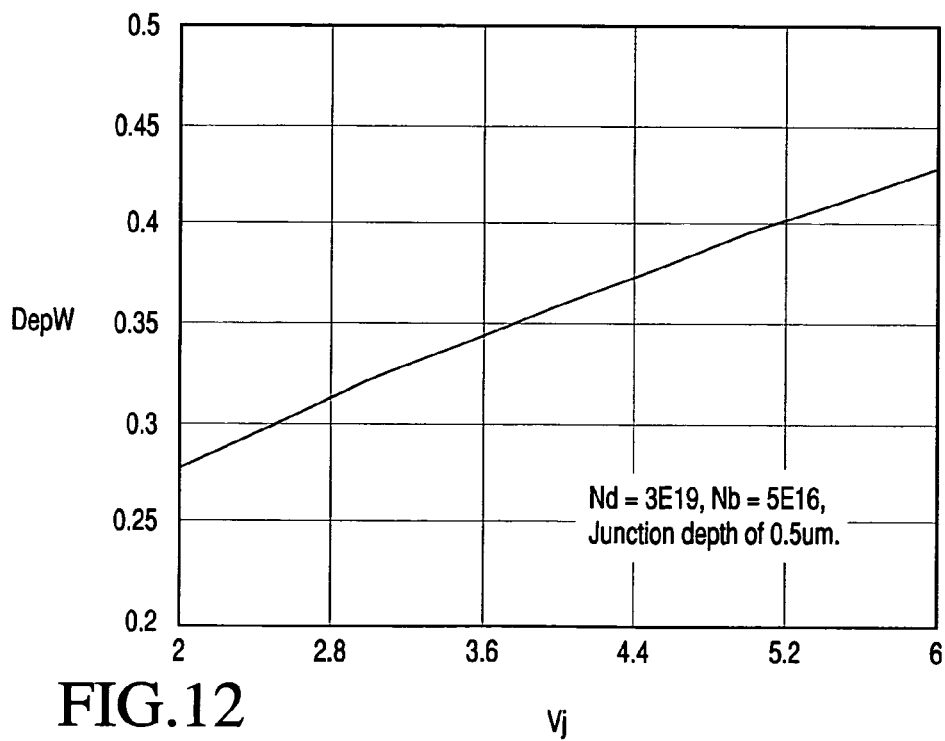
FIG. 12 is a graph of depletion width versus junction-to-bulk potential for an exemplary embodiment of the inventive resettable fuse device.

Shown in FIG. 12 is a graph of the depletion width of a junction, in $\mu m$, versus junction to bulk potential, Vj, for a structure with Nd=3E19, Nb=5E16 and a junction depth of 0.5 $\mu m$. FIG. 12 can be used to set the allowed tolerance of the spacer 31, shown in FIG. 3, which essentially determines the depletion width D shown in FIG. 7. From this example, a 225-angstrom spacer having a 22-angstrom tolerance, which is an unusually large tolerance, can be employed.

To minimize hot electron effects in the exemplary embodiment being considered, it is necessary, as discussed earlier, to avoid the condition Vgs=0.5 Vds, i.e., the peak hot electron injection condition, so as to minimize this source of device degradation. Incorporating a typical design tolerance of +/−50 mV, the actual maximum voltage should be limited to 2.3 V. Referring to FIG. 12, it appears that the proposed tolerance for spacer 31 is consistent with this added limitation, thus allowing for a workable and reliable invention. In other words, FIG. 12 shows that at 2.3 V, the depletion width is in excess of the worst-case spacer thickness of approximately 247 angstroms. Thus, the channel would be completed and the soft fuse would activate with a voltage on node 80 of 2.3 V, and the gate voltage rising first, also to 2.3V.

Figure 10:
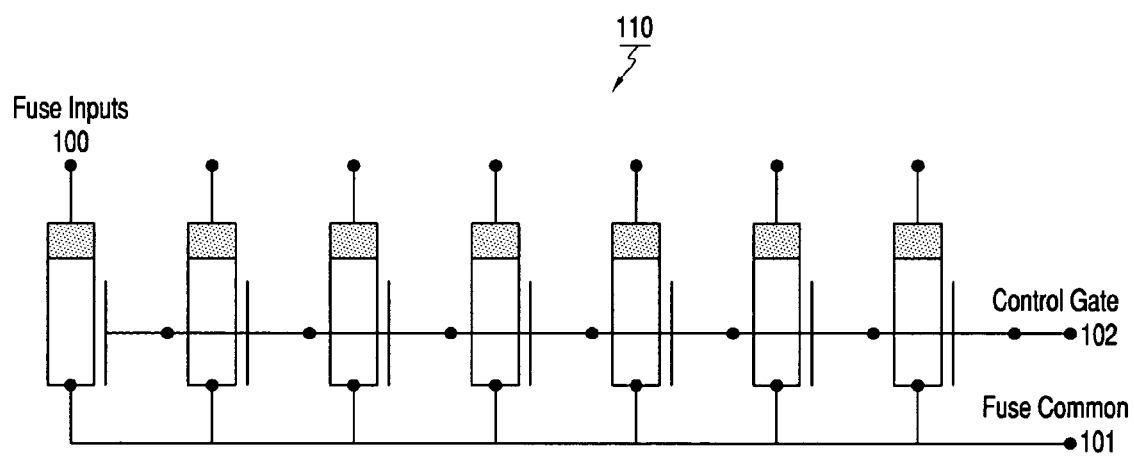
FIG. 10 is a schematic representation of an array of soft fuses according to the present invention.

As illustrated in FIG. 10, the present invention provides the means for constructing soft fuse devices whereby an array 110 of such devices can be implemented on a integrated circuit chip having individual fuse inputs 100 at the drains of the soft fuse devices, a fuse common 101, and a common control gate 102. When an error, or "fail" is detected in an integrated circuit due to a failing element on the circuit chip, a signal is sent to the drain of one of the soft fuses in the array of soft fuses, causing that particular soft fuse device in the array to conduct providing a path for replacing the failing circuit element by another. The failing element, as an example, could be a bit line in a memory array, or an inductor or capacitor in an analog or RF circuit. The soft fuses of the present application are intended for dynamic use, meaning that these soft fuses can be used throughout the lifetime of the integrated circuit chip, and not just during the initial manufacturing or testing phase. Thus, the dynamic fuse can be applied to repair fails which occur during the actual lifetime usage of the integrated circuit chip in which it is integrated. The soft fuse can be implemented to temporarily repair a fail that may or may not to be followed by a permanent repair. The possible applications include:

1) In an ECC (error correction code) environment, to take care of SER (soft error rate) events. As CMOS scaling continues to increase aggressively, the concern about SER is becoming one of the major challenges.
2) Repair of "soft fails", e.g. fails that occur in a certain temperature range or at a high or low-temperature. This type of fail could be time-dependent and occur at some point during lifetime usage due to some parametric shift of (e.g., threshold voltage, device current) of the device during operation.
3) Repair of "soft fails" that occur only in a certain mode of operation of the integrated circuit chip. For example, high or low voltage ranges of operation may occur for the same input voltage mode or may occur because of switching from one mode of voltage to another in a certain circuit of the integrated chip. This type of fail could also be time-dependent, occurring either at initial use or during the lifetime operation of the integrated circuit chip.
4) Repair of fails that are not classified as "soft fails", but are time-dependent fails such as capacitor fails leading to leakage degradation of the capacitor isolation, or inductor fails leading to either short-circuit of at least part of the inductor coil or high resistance developing in the inductor. Examples also include bit line failure during operation in a memory chip.
5) Repair of fails due to ESD (electrostatic discharge) events that may occur at some point during the lifetime usage of the integrated chip.

It should be understood that the invention is not necessarily limited to the specific process, arrangement, materials and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. A resettable fuse device, comprising:
   a semiconductor substrate;
   a gate region formed in one surface of the semiconductor substrate and having a first end and a second end;

a source node formed in the one surface of the semiconductor substrate, in proximity to the first end of the gate region;

an extension region formed in the one surface of the semiconductor substrate, connecting the source node to the first end of the gate region;

a halo region formed between the extension region and the first end of the gate region; and a drain node formed in the one surface of the semiconductor substrate, in proximity to the second end of the gate region and separated from the gate region by a distance such that upon application of a predetermined bias voltage to the drain node a connection between the drain node and the second end of the gate region is completed by junction depletion.

2. The resettable fuse device of claim 1, wherein the halo region and the extension region are formed by injection of impurities into the one surface of the semiconductor substrate.

3. The resettable fuse device of claim 2, wherein the halo region is formed with a different impurity type than the extension region.

* * * * *